(12) United States Patent
Cho

(10) Patent No.: US 11,127,872 B2
(45) Date of Patent: Sep. 21, 2021

(54) SYSTEM FOR POWER GENERATION USING SOLAR ENERGY

(71) Applicant: Hans Se-young Cho, Vienna, VA (US)

(72) Inventor: Hans Se-young Cho, Vienna, VA (US)

( * ) Notice: Subject to any disclaimer, the term of this patent is extended or adjusted under 35 U.S.C. 154(b) by 190 days.

(21) Appl. No.: 16/326,285

(22) PCT Filed: Aug. 2, 2017

(86) PCT No.: PCT/US2017/045031
§ 371 (c)(1),
(2) Date: Feb. 18, 2019

(87) PCT Pub. No.: WO2018/044477
PCT Pub. Date: Mar. 8, 2018

(65) Prior Publication Data
US 2019/0221697 A1    Jul. 18, 2019

Related U.S. Application Data

(60) Provisional application No. 62/383,013, filed on Sep. 2, 2016, provisional application No. 62/383,026, filed
(Continued)

(51) Int. Cl.
*H01L 31/053* (2014.01)
*F03G 6/00* (2006.01)
(Continued)

(52) U.S. Cl.
CPC .............. *H01L 31/053* (2014.12); *F03G 6/00* (2013.01); *F03G 6/001* (2013.01); *F03G 6/003* (2013.01);
(Continued)

(58) Field of Classification Search
CPC ........ H02S 40/425; H02S 40/44; H02S 10/10; H02S 10/30; H02S 40/40; H02S 40/42;
(Continued)

(56) References Cited

U.S. PATENT DOCUMENTS

2011/0265872 A1* 11/2011 Gustafson ............... H02S 40/44
136/259
2015/0299013 A1* 10/2015 Dakhil ...................... C02F 1/14
210/602

(Continued)

*Primary Examiner* — Daniel P Malley, Jr.
(74) *Attorney, Agent, or Firm* — Olympic Patent Works PLLC

(57) ABSTRACT

An apparatus including a photovoltaic panel; a first fluid container thermally attached to a bottom of the photovoltaic panel; and a temperature sensor for sensing temperature of a fluid inside the first fluid container is part of a sub-system for a power generation system using solar energy. The sub-system further includes a heating assembly, including a second fluid container, a second temperature sensor, and an electrical heating element. The second fluid container is fluidically connected to the first fluid container. The heating element is configured to heat the pre-heated fluid in the second fluid container to its vapor state. The sub-system additionally includes a turbine generator fluidically connected to the second fluid container to generate AC power from the vapor. A system employing a plurality of sub-systems and a method for using the sub-systems are also provided.

6 Claims, 10 Drawing Sheets

Related U.S. Application Data on Sep. 2, 2016, provisional application No. 62/383,036, filed on Sep. 2, 2016.

(51) Int. Cl.
*G01K 13/02* (2021.01)
*H02J 7/35* (2006.01)

(52) U.S. Cl.
CPC ............... *G01K 13/02* (2013.01); *H02J 7/35* (2013.01); *Y02E 10/46* (2013.01)

(58) Field of Classification Search
CPC . H01L 31/053; H01L 31/052; H01L 31/0521; H01L 31/0523
See application file for complete search history.

(56) References Cited

U.S. PATENT DOCUMENTS

2015/0357970 A1* 12/2015 Mao .................... F24D 19/1057
    136/248
2017/0038096 A1* 2/2017 Hilliard ................... F24S 80/56

* cited by examiner

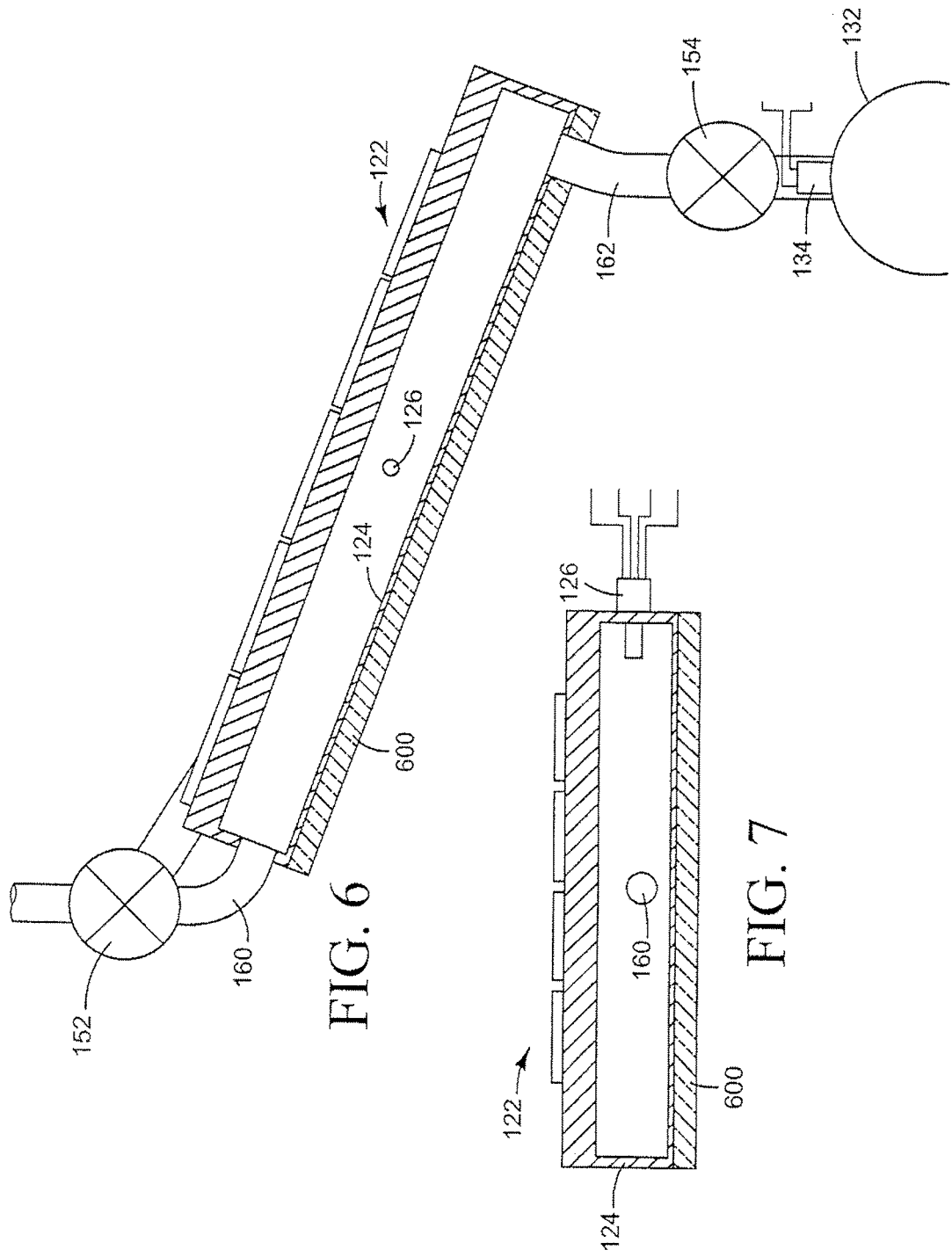

SYSTEM FOR POWER GENERATION USING SOLAR ENERGY

CROSS-REFERENCE TO RELATED APPLICATIONS

The present application claims priority from the following US provisional applications: (1) Application Ser. No. 62/383,013; (2) Application Ser. No. 62/383,026; and (3) Application Ser. No. 62/383,036, all filed on Sep. 2, 2016, in the name of the instant inventor, Hans Se-young Cho.

BACKGROUND

Power generation using energy from the sun's radiation, generally referred to as "solar energy", has been practiced for several decades. It has become a representative form of "renewable" energy sources that have received increasing attention due to concerns regarding the scarcity, sustainability, and security of fossil-sourced hydrocarbon fuels, which are the dominant source of electrical and other power used by human society today.

Solar energy generation practiced today can be categorized largely into photovoltaic generation and solar thermal generation. In the case of photovoltaic generation, solar radiation incident on a semiconducting solid excites an electron from a lower to a higher energy level, after which it and its positively charged counterpart, a simultaneously formed hole, are spatially separated and collected at opposite electrodes to constitute a current. In solar thermal generation, the heat of a body exposed to the sun's radiation is directly or indirectly transferred to human use—directly in the form of heated water or air, or indirectly in the form of steam used to turn a turbine that in turn generates electricity. Other minor forms of solar electricity generation have been proposed and demonstrated at the laboratory level, such as thermoelectric generation and solar-driven hydrogen generation and capture.

In the conventional methods of electrical generation that include photovoltaic and solar thermal power, the amount of power that can be produced per unit area of the solar energy device and/or per unit cost of manufacturing, installing, and maintaining the device is severely limited by factors inherent to the principles underlying the respective devices.

For photovoltaic devices, the fractional amount of solar energy that is extracted in the form of electricity, or the photovoltaic efficiency, is limited primarily by two factors: (1) the electrical bandgap of the material, which determines the voltage, and (2) the fraction of the solar radiation spectrum that possesses energy that is greater than the bandgap energy, or Eg. Photons in the solar radiation each possess a frequency v, and the energy of each photon is expressed as hv, where h is Planck's constant. Only photons with energy hv that equals or exceeds Eg of a given semiconductor material are able to excite electrons within the semiconductor's valence band to the conduction band, where the electrons, along with the resulting holes in the valence band, may be extracted as current. The picture is complicated in the case of indirect bandgaps, but the general principle is maintained that a certain threshold of photon energy is needed to excite photons to a level sufficient for current to be collected and made useful for external work.

The photons with energy below Eg are not absorbed, and either exit the photovoltaic material without interaction, or are absorbed as heat in the substrate or other regions of the device. Other factors limiting the efficiency of the solar energy device are the recombination of electrons and holes before they are extracted from the device as current, and loss of energy from excited electrons which occurs when the energy of the photons exceeds Eg and the excess energy is transferred to phonons, which are mechanical vibrational modes, in the photovoltaic material.

As a result of all these different processes that lead to loss, the efficiency of a photovoltaic device is far from 100%. In the case of monocrystalline Si, the typical efficiency is only around 21%, and polycrystalline and amorphous Si, which are cheaper to produce and therefore would be more desirable to use in large quantities, show efficiencies far lower. The energy that is not converted to electrical power is generally lost in the form of heat. Semiconductors with higher bandgaps, and combinations of multiple semiconductors with different bandgaps—known as multi-junction solar cells—can achieve photovoltaic efficiencies much higher (above 50% has been achieved in laboratory conditions), but only by using more expensive materials and more complex and costly manufacturing processes. As a further adverse effect of inefficient photovoltaic conversion, the efficiency of a solar cell generally decreases with increasing temperature, which may lead to a feedback loop of heating and lower efficiency. Another issue affecting the efficiency of photovoltaic devices is that the current generated is in direct current (DC) form, while electrical power transmission and usage is typically in the form of alternating current (AC). Converting the DC power to AC also introduces energy losses to the power generation process, and requires inverters and other specialized electronics hardware that add cost to the system.

Solar thermal energy also faces inherent problems for implementation. In most locations on the earth's surface, the density of solar radiation incident on a surface is usually insufficient to boil significant quantities of water (or other fluid) in contact with that surface, and therefore kinetic energy of steam heated in this way cannot be utilized to reliably generate electricity. To overcome this, methods of focusing or otherwise concentrating solar radiation incident on a broad area onto a smaller area are used to heat significant quantities of water or other fluids to a sufficient temperature. This increases the cost in terms of hardware and area used per unit of electrical energy generated. Moreover, the geometrical and environmental constraints related to concentrating or focusing sunlight make it less reliable and more susceptible to local and variable temporal conditions than photovoltaic methods. It is less flexible, and more difficult to implement in most urban or residential settings. As a matter of fact, both photovoltaic and solar thermal methods of solar energy utilization are heavily dependent on the weather, time of day, local shading, and cleanliness conditions.

In the prior art, several methods have been proposed to harness the heat absorbed by the body of a solar panel. An obvious method is to incorporate a heat exchanger, such as is used in a solar thermal unit, into a photovoltaic panel, and thereby capture the heat absorbed by the photovoltaic panel that would otherwise be wasted. In some prior art publications, such as Fleshsig et al (WO 2011/012917 A1), Charlton et al (U.S. Pat. No. 6,434,942 B1), Elazari (US Pat. Publ. 2011/0272003), and others, the heat is used to convert water into steam, and turn a generator turbine. In the process, the photovoltaic cell is cooled as well. However, as already noted, the heat absorbed by the solar panel itself is generally insufficient to convert water to steam, as the areal energy density of the sun incident on most regions of the earth is limited. To bring water to boiling, there typically needs to be augmentation of the absorbed solar heat by other means, and the prior art mentions solar light concentration, heating by passing the fluid through multiple stages of solar thermal heat exchangers, or heating by fossil fuels such as natural gas, as means of elevating the temperature of water to the boiling point and above. Still, these methods in the prior art do not fully overcome the limitations of solar thermal power generation, as they require energy to be supplied by other power sources or utilization of solar energy collected over larger areas to augment the heating within the area of the photovoltaic unit itself. In effect, these reduce the efficiency of electrical power conversion from the combined photovoltaic and solar thermal components of solar energy available on a given area.

The present invention proposes to overcome the limitations of both photovoltaic and solar thermal approaches to solar power generation, and the previous combinations thereof, by describing a sub-system, system, and method to reliably extract a higher percentage of the sun's energy from bodies exposed to sunlight at a lower cost per unit Watt-hour.

BRIEF DESCRIPTION OF THE DRAWINGS

FIG. 6 is a cross-sectional view, taken along the line 6-6 of FIG. 5.

FIG. 7 is a cross-sectional view, taken along the line 7-7 of FIG. 5.

DETAILED DESCRIPTION

Figure 1:
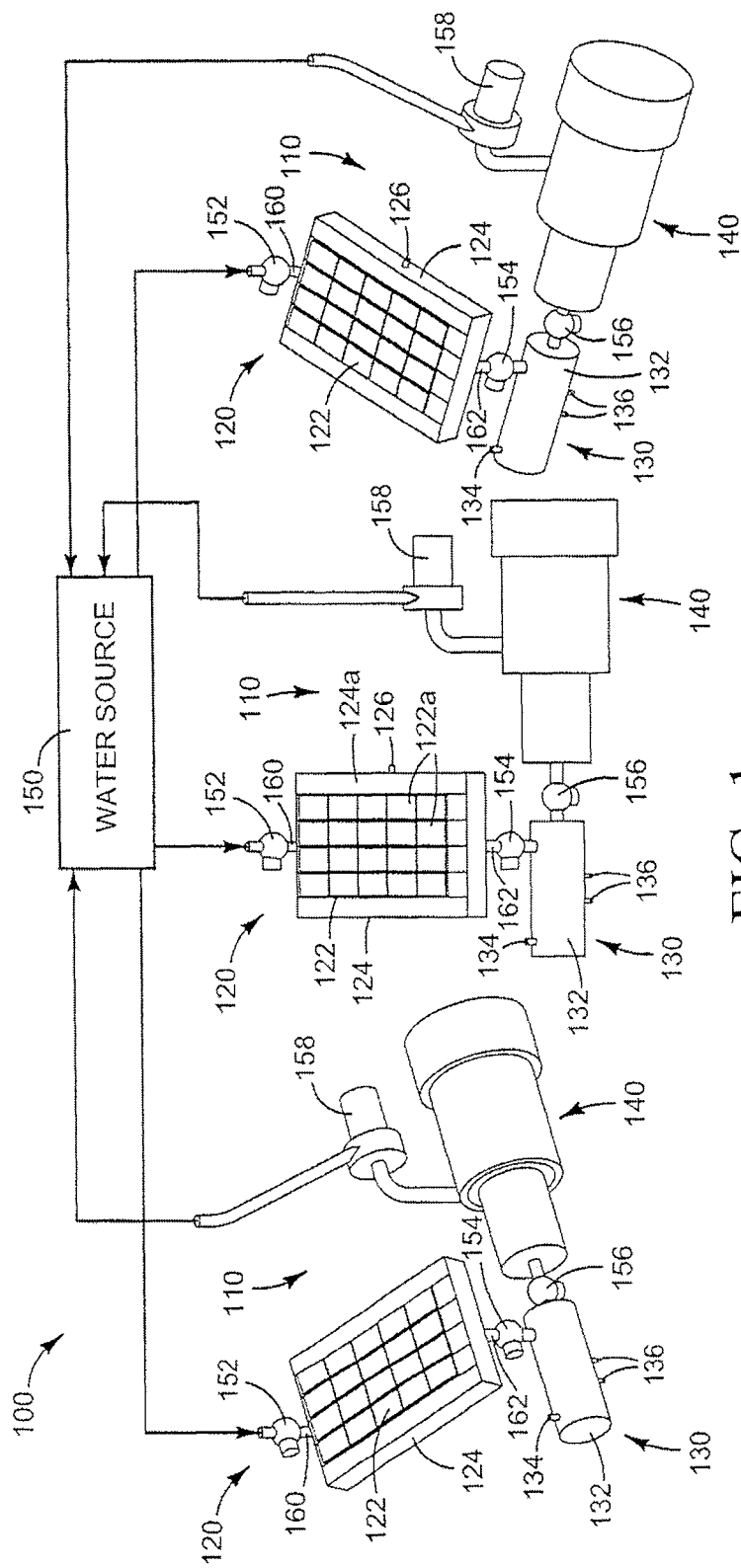
FIG. 1 illustrates a system, including three sub-systems that each include a photovoltaic panel and a first fluid container, with the photovoltaic panel in thermal contact with the first fluid container, according to an example.

As is well understood from the prior art extending to antiquity, liquid water can be transformed to a vapor, known as steam under most atmospheric conditions, by heating it above its boiling point, a process accompanied by expansion of its volume by about 1600 times. The kinetic energy of the expanding vapor is able to perform useful mechanical work when constrained to be applied onto the desired body or machine. The use of steam power has driven the Industrial Revolution, brought about the Electrical Age, and has transformed our material civilization to its present form.

The conventional fuel for heating water to its boiling point has been fossil fuel hydrocarbons such as coal. This is an understandable development, as fossil hydrocarbons possess a high-energy density and have been found in great abundance. Heat energy deriving from nuclear reactions has also been utilized for boiling steam for electrical power generation, taking advantage of the tremendous energy densities achieved in nuclear reactors. Solar energy, however, has had difficulty being used as a method of boiling water, primarily because of its lower energy density per volume (or area, which is a more typical measure of spatial resource utilization for solar energy). Under most conditions experienced on the earth's surface, heating from sunlight exposure is not sufficient to boil significant quantities of water, which has a high thermal capacity. To illustrate from common experience, while a few drops of water might quickly evaporate upon contact with a hot surface heated by the sun, such as a dark-colored car hood, and might do so with a hiss of transforming to steam, anything more will rapidly cool the surface and the water will fail to boil or evaporate. (The distinction between boiling and evaporation will not be covered in detail here.) Solar thermal used for steam generation therefore requires the sunlight naturally incident on a given area to be concentrated onto an area many times smaller to sufficiently heat a body and the water contained within or otherwise in thermal contact with it.

In the present teachings, the heat from solar radiation incident onto a body, which pre-heats the water contained within or otherwise in thermal contact with it, is augmented by heating of the preheated water by an electrical heating element powered by an external source of electrical current. The external electrical power source is most ideally also solar in the form of photovoltaic current generated from devices integrated onto the same body, but may also include other forms of renewable energy, or batteries, and may even be sourced from the electrical grid in general, regardless of the method of generation.

An exemplary description of this teaching is given as follows. A first fluid container, the surface of which is at least partly comprised of a photovoltaic panel, absorbs solar radiation, and transfers heat from the solar radiation to a fluid, usually water, contained therein. As the fluid is heated, its temperature is periodically measured by a sensor within the first fluid container, and when the fluid exceeds a certain temperature threshold, the sensor or an external control device such as a computer or controller sends a signal to open a valve at the bottom of the first fluid container, allowing the heated fluid to exit into a second fluid container, which contains an electrical heating element or heater. This electrical heating element, powered by an external current source, is also controlled by signals emanating from an external control device. Also, another temperature sensor is located in the second container, to monitor the temperature of the fluid as it is being electrically heated and send its readings to the external control device. The externally sourced electrical heating element brings the pre-heated water to a boil, and the steam is released at the appropriate time into a fluidically-connected turbine generator, completing the conversion of the heat energy to electricity. In this way, the latent heat absorbed in the water is extracted as useful work with losses determined only by the Carnot Efficiency of the heat engine.

As used herein, the article 'a' is intended to have its ordinary meaning in the patent arts, namely 'one or more'. For example, 'a multibeam element' means one or more multibeam elements and as such, 'the multibeam element' means 'the multibeam element(s)' herein. Also, any reference herein to 'top', 'bottom', 'upper', 'lower', 'up', 'down', 'front', back', 'first', 'second', 'left' or 'right' is not intended to be a limitation herein. Herein, the term 'about' when applied to a value generally means within the tolerance range of the equipment used to produce the value, or may mean plus or minus 10%, or plus or minus 5%, or plus or minus 1%, unless otherwise expressly specified. Further, the term 'substantially' as used herein means a majority, or almost all, or all, or an amount within a range of about 51% to about 100%. Moreover, examples herein are intended to be illustrative only and are presented for discussion purposes and not by way of limitation.

Apparatus for Solar Energy Absorption

FIG. 1 depicts an overview of an embodiment of a system 100 comprising three sub-systems 110. Although three sub-systems 110 are shown, it will be understood that fewer or more than three sub-systems may be employed.

The sub-systems 110 may be each angled differently with respect to the sun, so that the sun will shine on at least one sub-system during a portion of a day. Indeed, using several sub-systems 110 may maximize utilization of the solar radiation from the sun without requiring the complexity of steering and tracking mechanisms commonly employed with solar panels.

Each sub-system 110 comprises an apparatus 120 comprising a photovoltaic panel 122, a first fluid container 124 thermally attached to the bottom of the photovoltaic panel, and a temperature sensor 126 for sensing temperature of a fluid inside the first fluid container.

The apparatus 120 is the basic unit of the system 100. The first fluid container 124 is in thermal contact with the photovoltaic panel 122, and may be in the form of a baffle or heat exchanger pipe assembly. In the ideal situation, the thermal contact ensures that as close to 100% of the heat from the photovoltaic panel 122 as possible is transferred to the first fluid container 124.

The first fluid container 124 contains a fluid, such as water or other fluid suitable for the purposes disclosed herein.

The photovoltaic panel 122 may consist of a plurality of photovoltaic, or solar, cells 122a for converting solar energy to DC power. The photovoltaic cells 122a may be disposed on a top surface 124a of the first fluid container 124. The photovoltaic cells 122a may consist of monocrystalline silicon or other semiconductor wafers or one or more of photovoltaic thin film cells. In some embodiments, the photovoltaic cells 122a on the surface 124a of the first fluid container 124 may comprise a semiconductor thin film that is amorphous, polycrystalline, or comprising of nanowires, either polymeric, or monocrystalline. The term "photovoltaic" is interchangeably used herein synonymously with "solar" with regard to the photovoltaic (solar) panel 122 and the photovoltaic (solar) cells 122a.

As used herein, the apparatus 120, also called an absorbing panel, contains a working fluid and absorbs solar energy. The fluid heats up due to exposure of the apparatus 120 to solar energy. The apparatus 120 also contains one or more sensors 126 to measure the temperature of the fluid at regular time intervals of, for example, roughly several minutes. Any solar energy not converted to DC power from the photovoltaic cells may be used to pre-heat the fluid in the first fluid container 124.

The first fluid container 124 is part of the apparatus 120, and is in intimate thermal contact with the photovoltaic cell(s) 122a or otherwise absorbing surface of the photovoltaic panel 122. The first fluid container 124 may be in the form of tubular channels within a metallic block, or a pipe or pipes bent into a coil, a baffle, multiple pipes in parallel, or a shaped channel with fin-like protrusions, or other configurations of fluid heat exchangers that are common in the art.

The first fluid container 124 may be constructed of stainless steel, aluminum, zinc-plated steel, copper, bronze, or any metallic engineering metal that resists corrosion and does not, in the form of the container assumed, suffer fracture or other failure due to thermal expansion and contraction occurring within the temperature range of about −20° C. to about 200° C. The front, or top, or sun-facing, surface 124a of the first fluid container 102 to which the photovoltaic cells 122a are adhered may consist of a semi-conducting thin film of one or more of the types enumerated above. The surface 124a may be glass, plastic, ceramic, metallic, or a combination of these. In an embodiment, the surface 124a of the first fluid container 124 may be textured or otherwise configured topographically to absorb a maximum fraction of incident sunlight. The texture may be imparted by the shape of the first fluid container 124.

The photovoltaic panel 122 may be adhered to the surface 124a of the first fluid container 124 by metallic fasteners, metal solder, welding, cement, epoxy or other adhesive glues, or mechanical compression. A thermal-conducting epoxy or adhesive may be employed to aid thermal transfer to the fluid in the first fluid container 124.

In an embodiment, the photovoltaic cells 122a may be directly deposited or otherwise formed onto the surface 124a of the first fluid container 124 such that the photovoltaic cell(s) is(are) conformally adhered to the fluid container without substantial gaps.

Figure 2:
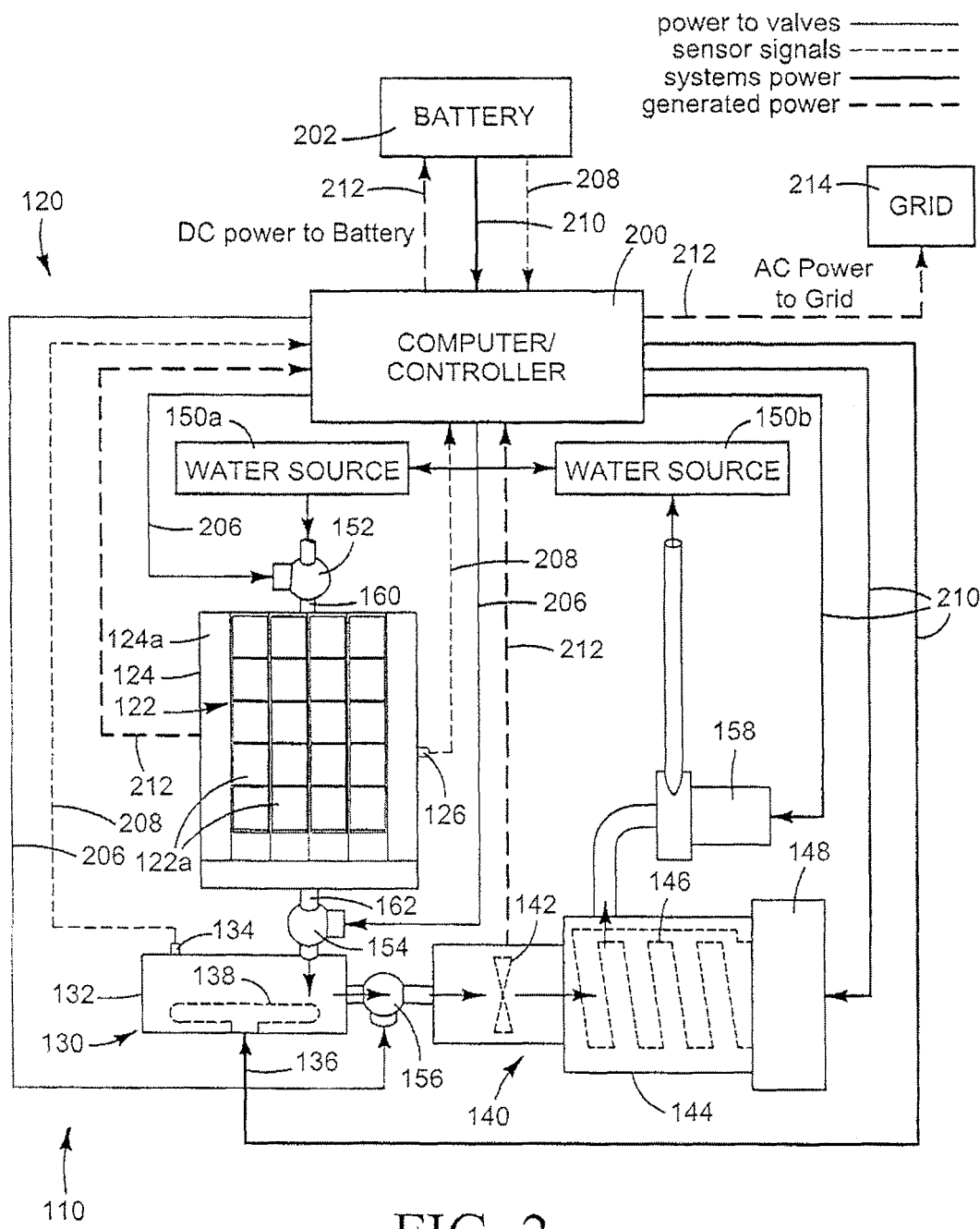
FIG. 2 illustrates details of one sub-system, according to an example.

There may be one or more sensors 126 that measure the temperature of the water, or fluid, within the first fluid container 124 at regular intervals and relay the measured values to an external computer (shown, e.g., in FIG. 2 as 200). In an embodiment, the sensor 126 within the first fluid container 124 or thermally coupled to the fluid within the first fluid container may be electrically coupled to the computer 200, as shown in FIG. 2. In another embodiment, the sensor 126 may be packaged together with a computer device, which may be a microelectronic chip or a device containing a microelectronic chip.

Each sub-system 110 also comprises a heating reservoir 130 comprising a second fluid container 132, fluidically connected to the first fluid container 124. The second fluid container 132 further includes a temperature sensor 134 and leads 136 to a heating element or heater (not shown in FIG. 1, but shown in FIG. 2 as element 138).

The rear, or bottom, or shaded side, of first fluid container may be covered with an insulating layer which prevents heat from escaping the first fluid container in that direction, which being shaded, is generally cooler. The surface of the heating reservoir may also be covered with an insulating layer, either in its entirety or partially towards the rear, bottom, or shaded side.

Each sub-system 110 further comprises a turbine generator 140, fluidically connected to the second fluid container 132. Details of the turbine generator 140 are shown in subsequent drawings. Essentially, the fluid is converted to vapor (steam, where the fluid is water) in the second fluid container 132 and released into the turbine generator 140, which converts the vapor to AC power by the rotation of a turbine (shown in FIG. 2 as element 142). The vapor is then condensed for recycling.

The system 100 includes a fluid source 150 to provide a working fluid, such as water, to the first fluid container 124. Controllable first valve 152 provides ambient temperature fluid to the first fluid container 124 from the fluid source, or reservoir, 150, while controllable second valve 154 provides fluid to the second fluid container 132 from the first fluid container 124. In the second fluid container 132, the fluid is heated from its liquid state to its vapor state. Controllable third valve 156 provides vapor to the turbine generator 140. After turning the turbine 142, the vapor is condensed to its liquid state, and the liquefied fluid is returned to the fluid source 150 by a pump 158. The controllable valves 152, 154, 156 are controlled by signals from a controller that is in turn controlled by the computer 200, both discussed in greater detail below.

An inlet pipe 160 connects the first valve 152 to the first fluid container 124 for introducing the working fluid. An outlet pipe 162 connects the first fluid container 124 to the second valve 154 to allow the working fluid to exit from the first fluid container and enter the second fluid container 132.

FIG. 2 depicts further details of one example sub-system 110. The same reference numbers used in FIG. 1 are employed in FIG. 2. Further details are shown as to the heating reservoir 130 and the turbine generator 140.

In addition to the elements described above, the heating reservoir 130 also includes an electrical heating element 138. The turbine generator 140 includes a turbine 142 and a cooling chamber 144, which contains a cooling coil, or condenser, 146 for condensing vapor (e.g., steam) to liquid (e.g., water). The turbine generator 140 further includes a cooling unit 148 to keep the cooling coils 146 cool. The cooling unit 148 may be a refrigerator. More commonly, to avoid using a portion of the power generated by the system 100 and thereby reducing its efficiency, the cooling unit 148 may be kept in a shaded area, at ambient temperature, such as behind or underneath the apparatus 120.

Two water sources 150a, 150b are shown. However, while the water sources 150a, 150b are shown as separate, they may be a single source 150, as shown in FIG. 1. Examples of water sources include municipal water, well water, ponds, water trucks, and the like.

While water is discussed herein as a heat transfer fluid, other HTFs may also be used. One commonly-used HTF is an antifreeze/water mix that typically uses non-toxic propylene glycol, although other glycols may be used. Examples of other HTFs include hydrocarbon oils and silicones.

Also shown in FIG. 2 is a computer/controller 200 and a battery 202. While both the computer/controller 200 and battery 202 are depicted as being associated with the sub-system 110, it will be appreciated that, in the typical case, the computer/controller 200 and battery 202 are common to all the sub-systems 110 in the system 100. The computer/controller 200 is configured to receive input from temperature sensors 126, 134 and other sources in each sub-system 110 as well as external data, to open and close valves 152, 154, 156 at appropriate times, and to send AC power to an electrical grid 214. The battery is configured to store DC power generated by the photovoltaic panel 122 and to provide DC power to heaters and other components internal to the system 100.

Thin solid lead lines 206 provide power from the battery 202, as directed by the computer/controller 200, to valves, such as valves 152, 154, 156. Thin dashed lines 208 carry sensor signals to the computer/controller 200 from sensors, such as sensors 126, 134 and from the battery 202. Thick solid lines 210 provide systems power to various components, including from the battery 204 to the computer/controller 200 and as directed by the computer/controller to the heater 138 and the pump 158. Thick dashed lines 212 provide generated power, such as power generated by the photovoltaic panel 122 and the turbine 142, both sent to the computer/controller 200, and such as AC power from the computer/controller 200 to the electrical grid 214. The grid 214 may be a local sub-station or part of a regional electrical system, for example.

There are two sources of power, DC power generated by the photovoltaic panel 122 and AC power generated by the turbine 142. DC power is consumed internally, for example, to heat the fluid in the second fluid container with the heater 138, to open and close the valves 152, 154, 156, and to power the pump 158. AC power is sent to the grid 214 for external consumption. Each sub-system 110 is configured to heat fluid and generate the DC power for internal use and the AC power for sending to the electrical grid 214.

Figure 3:
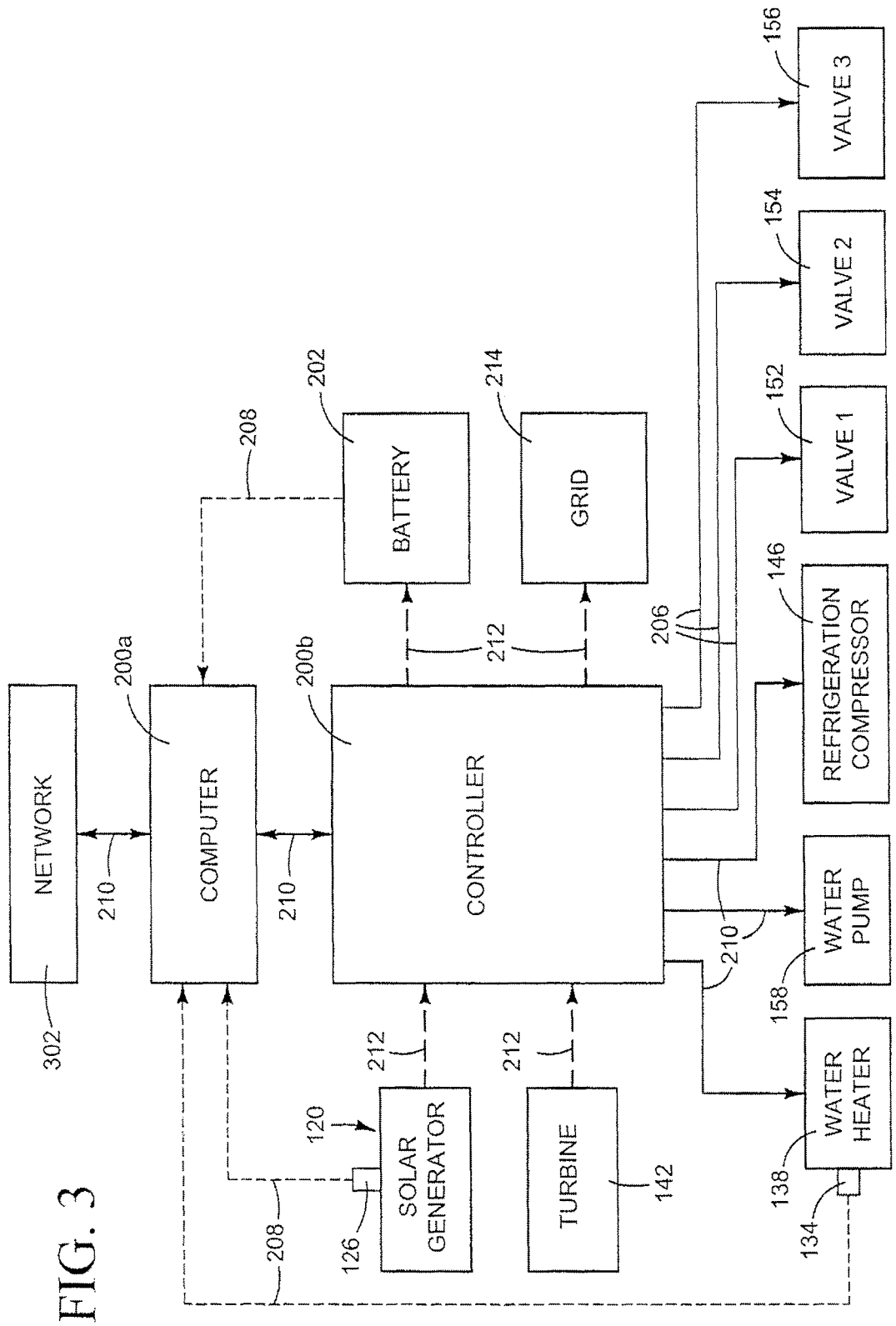
FIG. 3 illustrates a schematic diagram of electrical connections of various elements of a sub-system to a computer and a controller, with ability to switch between a battery and an electrical grid, according to an example.

FIG. 3 is a schematic diagram of an example of electrical connections of various elements of a sub-system 110 to a computer 200a and a controller 200b, with ability to switch between the battery 202 and the electrical grid 214. Again, it will be understood that the computer 202a, controller 200b, and battery 204 are common to a plurality of sub-systems 110. The same reference numbers used in FIGS. 1 and 2 are employed in FIG. 3.

In FIG. 3, the computer/controller 200 of FIG. 2 is shown as two separate components, computer 200a and controller 200b. The controller 200b includes a switch 300 that can send AC power from the solar generator (turbine) 142 to either or both of the battery 202 and the grid 214. In an embodiment, the switch 300 may be used to direct generated power to battery 202 and grid 214 at the same time based on processor instructions to the controller 200b.

A wired or wireless network 302, such as a WAN or LAN, with server, monitor, and other peripheral equipment may be used to interact with the computer 200a and others like it in similar sub-systems, as well as the external electrical power grid and the information of the internet at large.

The network 302 can receive a signal from an operator of the grid 214 that would instruct the computer 200a to signal the controller 200b to switch off the heater 138 and close at least the upstream water valve 152. When there is a problem with or maintenance of the grid 214, and the operator does not want new electrical generation coming in, the sub-system 110 has to know in a timely manner.

Regarding each sub-system 110 having a computer 200a, only one computer and a local network 302 may be needed for all sub-systems. Alternatively, there may be one computer 200a for each sub-system 110, with a "master" computer to which all the sub-system computers are connected.

There may be one controller 200b for all sub-systems 110. Alternatively, each sub-system 110 may have its own controller 200b. In an embodiment, there may be a single stand-alone computer 200a, independently signaling each of the controllers 200b of all the sub-systems 110. While controllers 200b may be able to handle more than one sub-system 110, each sub-system might require at least six lines of communication. There is also the potential issue of a single controller's hardware or software failing and bringing down the entire system 100.

Likewise, there could likewise be one storage battery 202 or plurality of batteries, each serving a sub-system 110. The battery (or batteries) 202 may be maintained in a fully charged state, or may be partially drained before recharging.

Figure 4A:
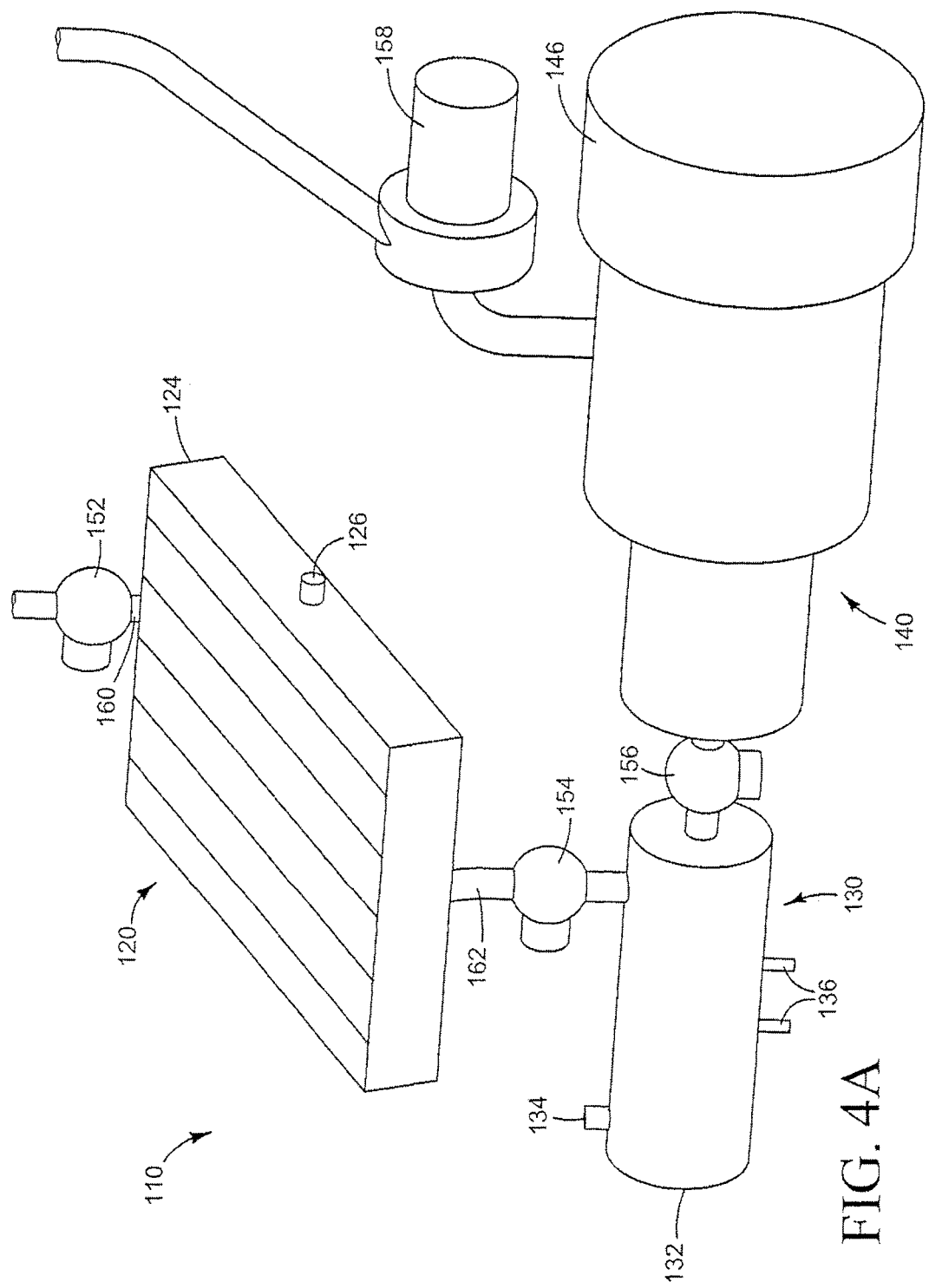
FIGS. 4A-4C illustrate different views of a single sub-system, with FIG. 4A showing the sub-system without a photovoltaic panel, FIG. 4B showing the reverse side of the sub-system, and FIG. 4O showing the sub-system with a photovoltaic panel, according to an example.
Figure 4B:
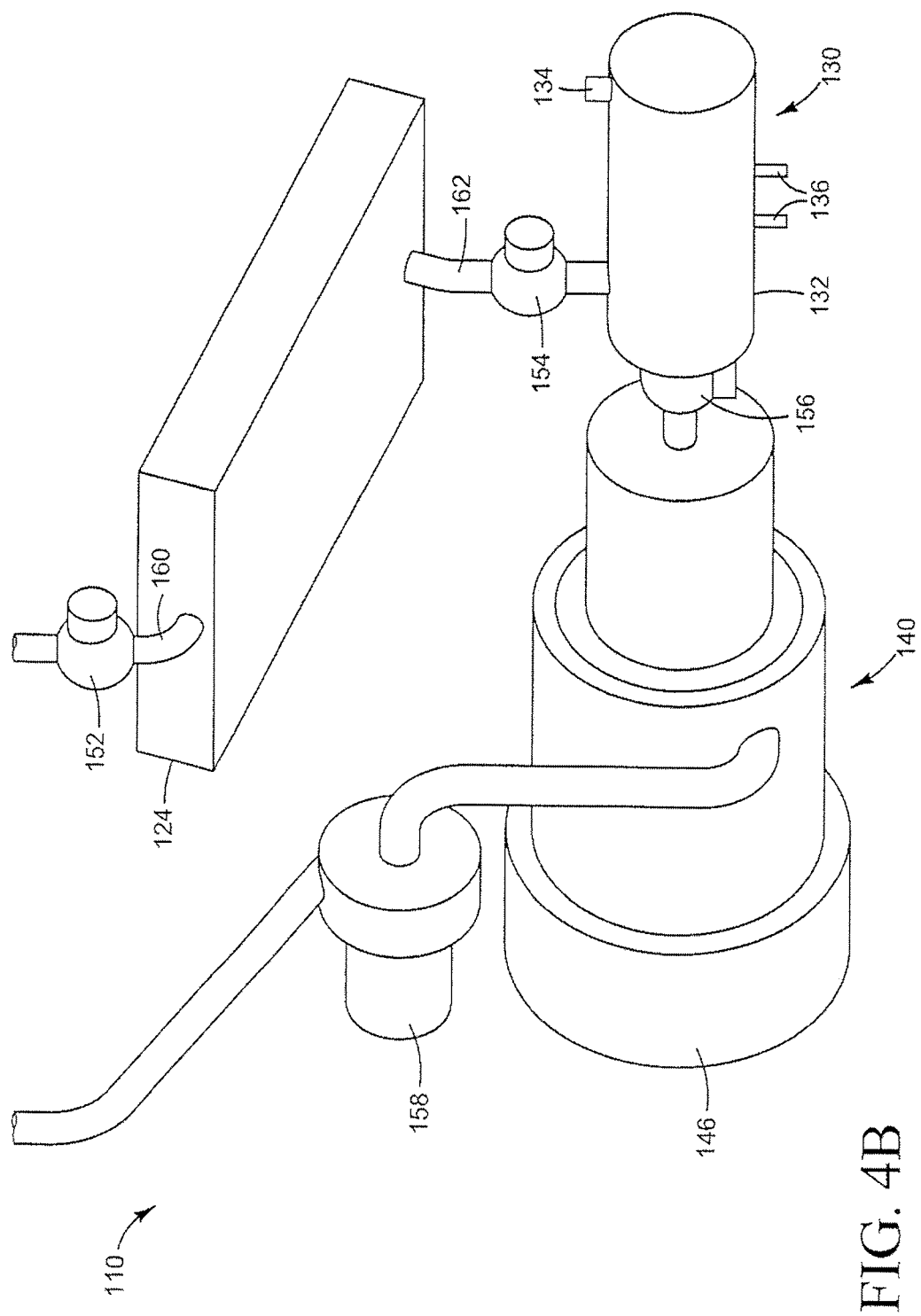
Figure 4C:
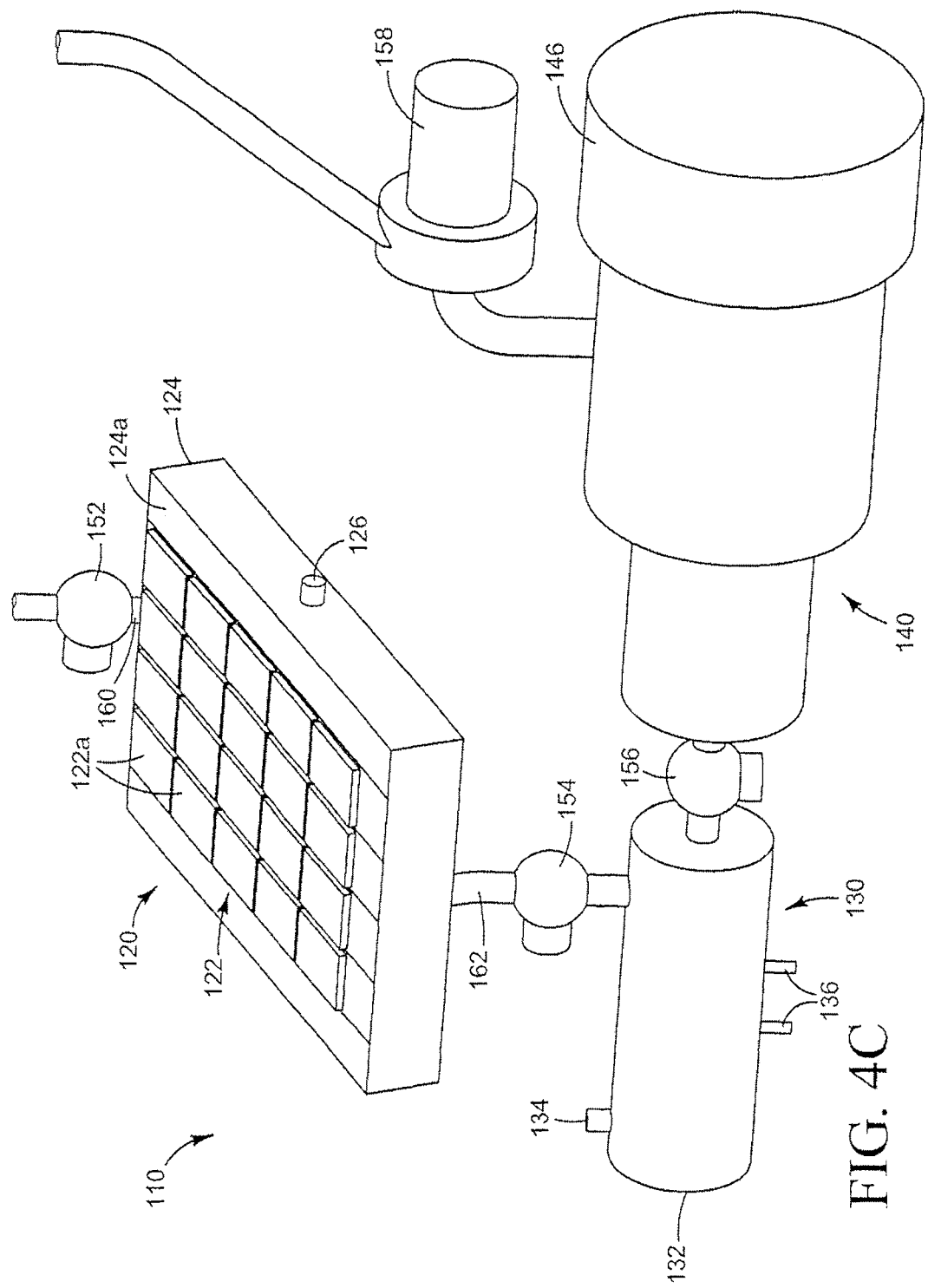

FIGS. 4A-4C provide further details of the sub-system 110. In particular, FIG. 4A shows the sub-system 110 without the photovoltaic panel mounted on the first fluid container 124. FIG. 4B shows the backside of the sub-system 110. FIG. 4C shows the sub-system 110 with the photovoltaic panel 122 mounted on the first fluid container 124. The same reference numbers used in FIG. 1 are employed in FIGS. 4A-40.

Figure 5:
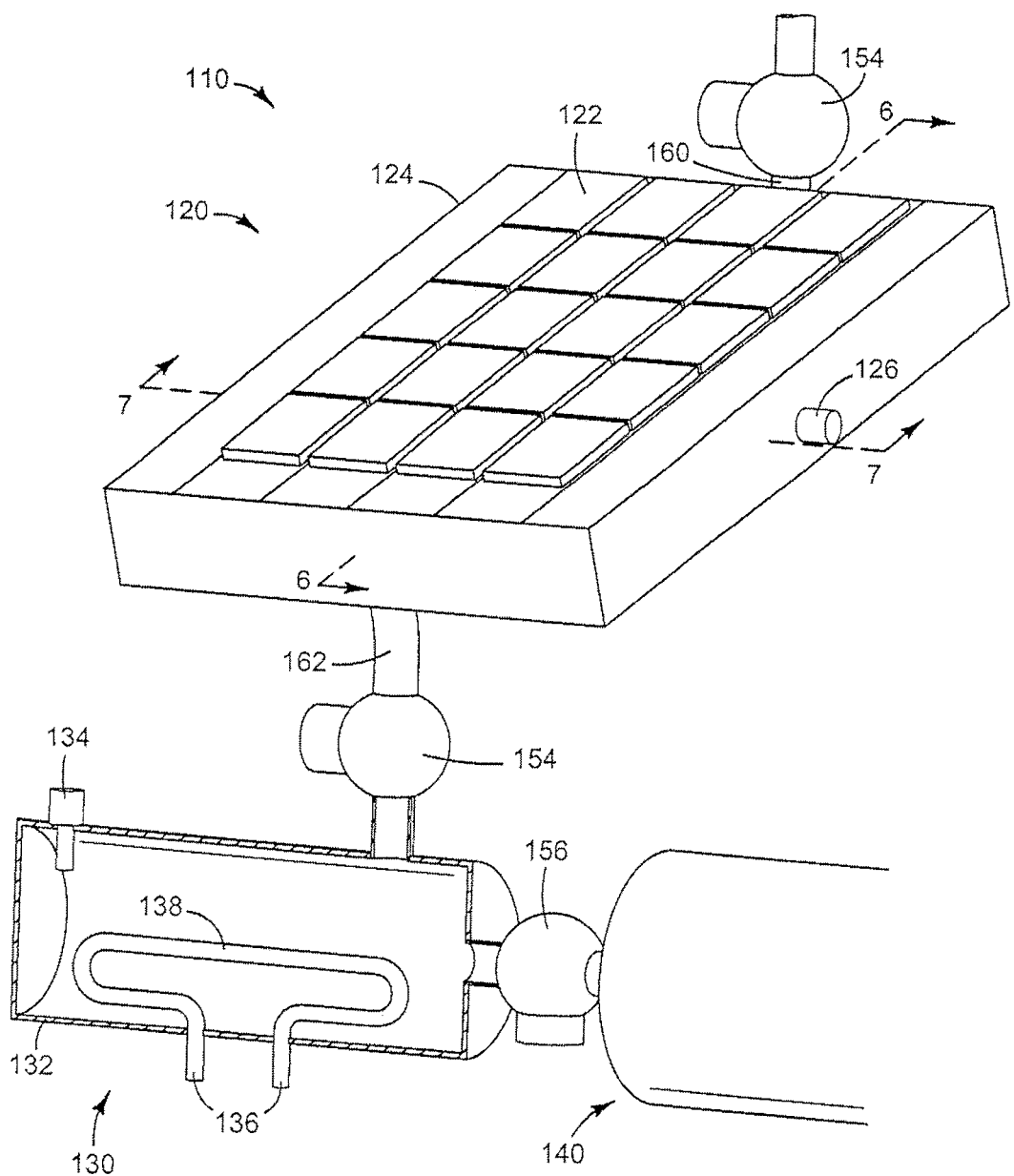
FIG. 5 is a view of a portion of the sub-system depicted in FIGS. 4A-4O, with a portion of the sub-system shown in cross-section, according to an example.

FIG. 5 depicts a portion of the sub-system 110, with the first fluid container 124 shown in section. The first fluid container includes the heater 138. FIG. 5 also depicts cross-sections 6-6 and 7-7 of the apparatus 120 that comprises the photovoltaic panel 122, the first fluid container 124, and the temperature sensor 126. FIG. 6 is a cross-sectional view taken along the line 6-6 of FIG. 5, showing a longitudinal cross-section through the first fluid container 124. FIG. 7 is a cross-sectional view taken along the line 7-7 of FIG. 5, showing a transverse cross-section through the first fluid container 124. An insulating layer 600 on the backside of the first fluid container 124 is shown in FIGS. 6 and 7, to help retain heat in the pre-heated fluid.

Figure 8:
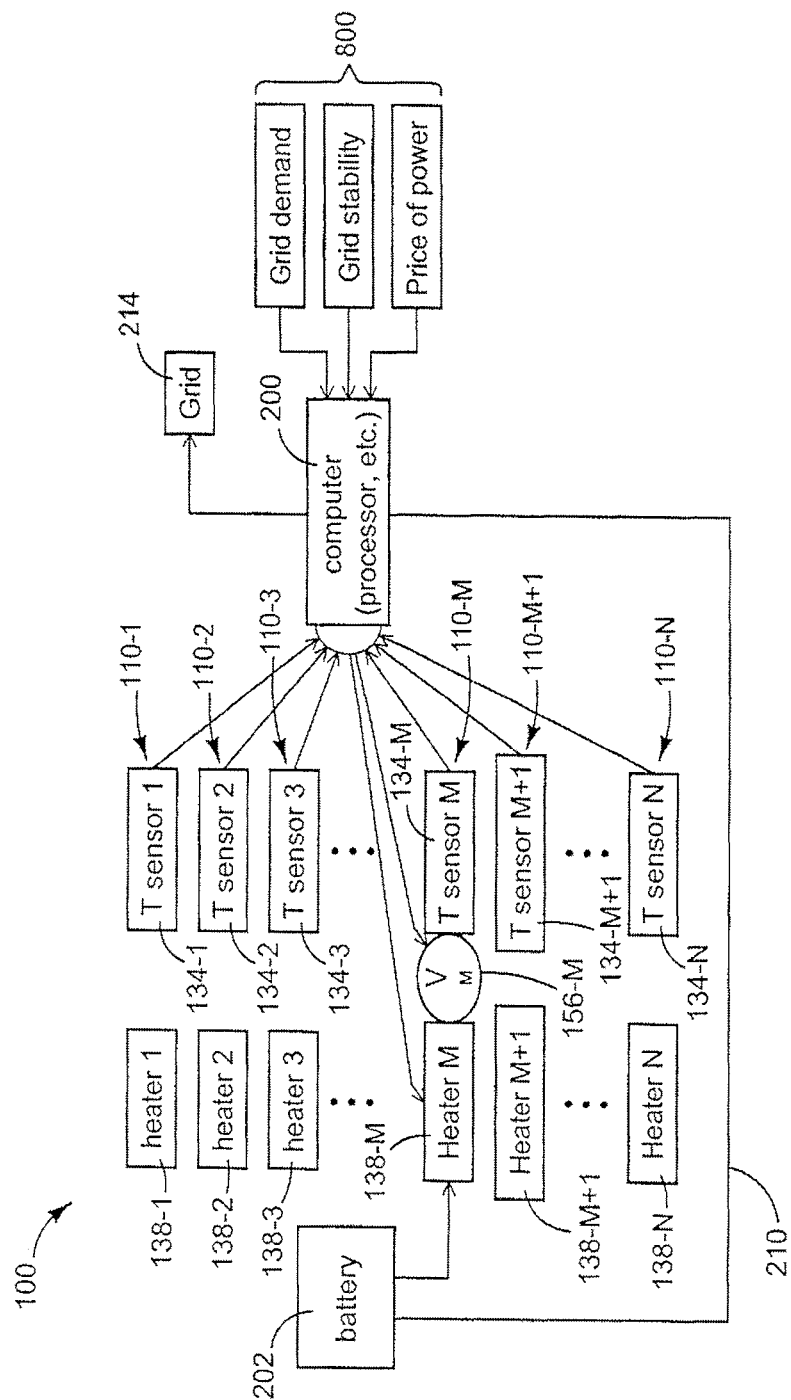
FIG. 8 is a schematic view showing a network of combined sub-systems from FIG. 1 to form a system, interconnected to and controlled by a computer/controller, with DC photovoltaic power stored at and delivered from a battery, according to an example.

FIG. 8 depicts a solar power system 100 comprising N sub-systems 110. Each sub-system includes a heater 138, FIG. 8 shows N heaters 138 (138-1, 138-2, 138-3, . . . , 138-M, 138-M+1, . . . , 138N). Each sub-system 110 also includes a temperature sensor 134. FIG. 8 shows N temperature sensors 134 (134-1, 134-2, 134-3, . . . , 134-M, 134-M+1, . . . , 134-N).

In operation, and referring primarily to FIGS. 1 and 2, control valve 152, when opened, releases the working fluid within the fluid source 150 through the inlet pipe 160 into the first fluid container 124, and which does so when instructed to do so by signals received from the computer/ controller 200. The fluid in the first fluid container 124 is pre-heated by solar energy. In this connection, the first fluid container 124 may be coated with a black coating, e.g., paint, to maximize absorption of heat from the sun.

The temperature of the fluid (e.g., water) in the first fluid container 124 is measured by the sensor 126, and the measured value is sent to the computer/controller 200 along line 208, which determines whether it is hot enough to heat further to boiling to generate vapor (e.g., steam) and turn the turbine 142. When it is determined that the fluid is hot enough, the computer/controller 200 sends a signal along line 206 to release valve 154 to send the pre-heated water from the first fluid container 124 to the second fluid container 132, where it is heated to a boil by heating element 138 using an external power source, which could be the photovoltaic Output of the photovoltaic panel 122. The computer/controller 200 also sends a signal along line 206 to release valve 152 that opens to replenish the fluid in the first fluid container 124 from the fluid source 150 that is at ambient (room, or much cooler) temperature.

The control valve 154 may be configured to open to release the fluid from the first fluid container 124 to a drain leading to the outside, upon receiving a signal from the computer 200. This would permit draining a sub-system 110 in the event of an impending freeze or for maintenance, for example.

The control valve 152, when opened, allows ambient temperature (unheated) fluid from an external source 150, such as a municipal reservoir, into the first fluid container 152, and does so when instructed to do so by signals received from the computer 200, or when an internal sensor (not shown) in the fluid container indicates it is sufficiently empty.

The system 100 is not dependent on the efficiency of the photovoltaic panel 122, and indeed can use extremely inefficient photovoltaic panels, as the energy that is not converted to photovoltaic energy is still captured as heat and converted into useful energy, such as for pre-heating the fluid in the first fluid container 124. Many varieties of photovoltaic cells 122a may be used on the surface of the photovoltaic panel 122, and may be integrated structurally onto the first fluid container 124 in various ways. Monocrystalline or multicrystalline wafers or plates, polycrystalline or amorphous films, polymers, nanocrystals, nanowire assemblies, etc. may be used as the photovoltaic cells 122a, and these may be coupled to a surface 124a of the first fluid container 124 by direct deposition, or by being deposited onto a separate substrate, which is in turn attached to the absorbing panel by welding, gluing, compression, soldering, bolting, riveting, etc. However, it may be desirable to maximize the thermal coupling between the photovoltaic panel 122 and the first fluid container 124. In this connection, a thermally-conducting adhesive (not shown) may be employed to enhance the thermal coupling. The photovoltaic cells 122a may not even need to cover the entire surface of the first fluid container 124, since the ultimate goal is not to maximize the photovoltaic element of the captured solar power, but rather the total conversion of the captured power.

The solar cells 122a may be any of the common solar cell material, such as silicon, germanium, III-V materials, II-VI materials, or combinations of these. Since cell efficiency is not critical, then, in some embodiments, the least expensive solar cells, such as thin film silicon solar cells, may be employed in the practice of the teachings herein. It is the combination of heat from the sun and DC power generated by the photovoltaic panels 122 that is used to generate a vapor (e.g., steam) to turn the turbines 142 and thereby generate AC power for transmission to the grid 214.

As the temperature state of the fluid in the first fluid container 124 is important in determining whether it is sufficiently pre-heated to boil with the available energy, or whether it is the closest among the sub-systems 110 in a connected network to being boiled (i.e., is the hottest), the temperature sensor 126 in the first fluid container 124 may be optimized to be accurate within the range of about 40° C. to about 100° C. The temperature sensor 126 is equipped with line 208 to communicate with the computer/controller 200, which may include simple electrical wires, wireless or wired data connections, or free-space optical connections. The computer/controller 200 may be connected likewise with many similar sensors within other similar fluid containers 124 of other sub-systems 110 by lines similar to line 208.

Several similar solar power sub-systems 110 may be connected by an information network, and deliver electrical power to one another as is most efficient for generating power from a given pre-heated body of water. For example, in such a network of solar power sub-systems 110, the temperature sensors 126 in each first fluid container 124 and each second fluid container, or heating reservoir, 132 may send their readings to a central or local computer, such as computer/controller 200, which may determine that the water in a particular first fluid container 124 (e.g., Apparatus A) has reached a sufficient pre-heated temperature to boil with the amount of electrical energy available at the moment, such as from the aggregate of photovoltaic panels 122. The combined photovoltaic electrical power from the network of photovoltaic panels 122 may then be delivered to Apparatus A's second fluid container 132 for heating to bring it to a boil, and the energy is extracted, such as by means of a turbine generator 140. Afterwards, the computer/ controller 200 searches for the next sub-system 110 to reach a threshold temperature, and the process is repeated. This example enables the system to adjust to the local and temporal fluctuations of the incident solar radiation on any given photovoltaic panel 122. The conditions over many panels may vary, but at any given moment, the water in the most optimally heated first fluid container 124 will be boiled with the combined photovoltaic power of the networked absorbing panels. This enables solar panels 122 to be facing in different, and even opposite, directions to contribute more efficiently to solar power generation at any given time, without repositioning and its attendant complex machinery for moving solar panels. The system (including a plurality of sub-systems) and methods of achieving this are described below. In general, each photovoltaic panel 122 has at least one photovoltaic cell 122a on its surface that is facing a direction in which it may be exposed to solar radiation for at least part of the day.

In this and other examples, the DC power from the photovoltaic panels 122 of each sub-system 110 may first be delivered to one or more batteries 202 or other power storage devices (not shown) and stored there until it is sent to a pre-heating sub-system and used to boil its sufficiently pre-heated water in the second fluid container 132.

In some situations, the fluid may need to be removed from the first fluid container 124 and the second fluid container 132 and drained to the outside. This may be due to potential freezing during winter months. A valve (not shown) at the bottom of the two fluid containers 124, 132 may be opened to drain the fluid upon receiving a signal, either from a local temperature sensor 126 and/or computer/controller 200 or from a central computer that is monitoring weather conditions.

Continuing with the discussion of the operation of system 100, the fluid (e.g., water) in the second fluid reservoir 132 is heated to its vapor state (e.g., steam). Valve 156 is an automatic release valve that releases the vapor into the turbine generator 140, where it causes the turbine 142 to spin and generate AC power. The power is sent along line 212 to the computer/controller 200, where it is sent to the grid 214. The vapor then passes into a cooling chamber 144, where it is condensed to its liquid state by cooling coils 146. The cooling coils 146 are kept cool by the cooling unit 148, which is operated by the computer/controller 200. The condensed liquid is returned to the water source 150 by pump 158, also operated by the computer/controller 200.

Consider a sub-system 110 having the combined configuration of apparatus 120 (including the photovoltaic panel 122, the first fluid container 124, and the temperature sensor 126), the heating reservoir 130 (the second fluid container 132, the temperature sensor 134, leads 136, and heater 138), and turbine generator 140 (turbine 142, the cooling coil 146, and the cooling device 148). In some embodiments, while the inlet to the turbine generator 140 may be exposed to the sun to enable continued heating by the sun, the majority of the turbine generator 140 is located under the sub-system 110, in particular, under the photovoltaic panels 122 or otherwise shielded from direct exposure to the sun. The other end (exhaust-side), where cooling of the vapor takes place by the cooling coils 146, is held at a temperature generally around typical room temperature or below. In this connection, it will be appreciated that in FIGS. 1, 4A, 4B, 4C, and 5, the photovoltaic panels 122 appear to be depicted as being smaller than the turbine generator 140. However, in practice, the photovoltaic panels 122 are as large as or larger than the turbine generator 140, because the exit end of the generator (and return to water source 150) is ideally cooler than the entrance.

The reason the exhaust-side of the generator body is held at a lower temperature and typically shielded from the sun is to maximize the thermal gradient across the turbine generator 140, and thereby maximize the Carnot efficiency of the steam engine. The respective locations of the low temperature reservoir and the configuration of the shielding are determined with the purpose of maximizing the thermal gradient. Upon entering the lower-temperature cooling chamber 144, the steam that has exited the turbine generator 140 will contract and condense into liquid, and this liquid water (or other fluid) is pumped or otherwise returned to the storage reservoir 150 by pump 158. The storage reservoir 150 is positioned higher than the photovoltaic panel 122 and the first fluid container 124, and connects to the fluid container via a pipe 160 regulated by automated valve 152. Water (or other working fluid) then can be reintroduced into the sub-system 110, specifically, the first fluid container 124, for repeated heating and generation of AC electricity. The rate of water return to the storage reservoir 150 may be regulated such that there is a constant flow of sufficiently preheated water from the apparatus 120 to the heating reservoir 130. This may be achieved by returning an equal amount of condensed water to the storage reservoir 150 as the amount of steam expelled into the generator at each generation event or over the course of multiple events.

In other embodiments, where the working fluid is water, the source of the water entering the first fluid container 124 may be a local municipal or other external water system, and the steam expelled from the turbine generator 140 may simply be released to the atmosphere instead of being captured, condensed, and returned to the inlet of the first fluid container 124.

AC power from the turbine generator 140 is sent to the grid 214 along electrical connections 212. DC power from the photovoltaic panel 122 is connected to the heating element 138 by electrical connection 210 to leads 136.

DC power from the photovoltaic panel 122 may also be delivered to an electromagnet, not shown, located within the turbine generator 140 in close proximity to the rotator coil of the turbine 142. The current flowing through the electromagnet induces a magnetic field, which in turn induces an AC current in the rotating coil of the turbine 142 when the steam from the heating reservoir 130 turns the coil. The electromagnet may replace a permanent magnet as the source of the magnetic field in the turbine 142, and thereby eliminate the material cost that would go toward the permanent magnet. However, the decreased cost of the magnet is balanced against the cost of the lost DC power that would otherwise be fully devoted to the heating of the water in the second fluid container 132.

The benefit of this method is that the combined efficiency of solar energy conversion to electricity is increased significantly by utilizing the heat absorbed by the area of a body, which represents the majority of the absorbed solar energy. When the body is a solar panel 122 with a given photovoltaic conversion efficiency, the majority of the unconverted energy is typically wasted as heat. Instead of directly using the photovoltaic current produced by the solar panel 122, the teachings herein apply the photovoltaic current 212 to further heat the water in the second fluid container 132 preheated by the "waste" heat absorbed in the first fluid container 124, and the combined heat brings the water to boil so that its energy can be extracted as AC power 212 by the steam turbine generator 140. As the Carnot efficiency of a heat engine is often greater than 50% under the anticipated operating conditions, the efficiency of the device described may exceed the typical photovoltaic conversion efficiency by a significant margin.

Each sub-system 110, and hence the system 100, is not dependent on the efficiency of the photovoltaic panel 122, and indeed can use extremely inefficient photovoltaic devices, as the energy not converted to photovoltaic energy is still captured as heat and converted into useful energy. Many varieties of photovoltaic cells 122a may be used on the surface of the photovoltaic panel 122, and may be integrated structurally onto the sub-system 110 and its first fluid container 124 in various ways. Monocrystalline or multicrystalline wafers or plates, polycrystalline or amorphous films, polymers, nanocrystals, nanowire assemblies, etc. may be used as the photovoltaic cell 122a, and these may be coupled to the photovoltaic panel 122 by direct deposition, or by being deposited onto a separate substrate, which is in turn attached to the absorbing panel by welding, gluing, compression, soldering, bolting, riveting, etc. However, it may be desirable to maximize the thermal coupling between the photovoltaic panel 122 and the first fluid container 124. In this connection, a thermally-conducting adhesive (not shown) may be employed to enhance the thermal coupling. The photovoltaic cells 122a may not even need to cover the entire surface 124a of the first fluid container 124, as the ultimate goal is not to maximize the photovoltaic element of the captured solar power, but rather the total conversion of the captured power.

In an example, there does not need to be an integrated photovoltaic panel 122, since the electric power used to finally boil the preheated water can come from any number of external sources. The teachings herein therefore can be considered to be agnostic to the source of the external electrical power. However, the most desirable examples of the sub-system 110 are those that utilize both photovoltaic panels 122 and solar-powered thermal elements 138 of the absorbed solar energy to maximize the conversion to electrical power.

As the temperature state of the water in the first fluid container 124 is important in determining whether it is sufficiently pre-heated to boil with the available energy, or it is the closest among the sub-systems 110 in a connected network to being boiled (i.e., is the hottest), the temperature sensor 126 in the first fluid container 124 may be optimized to be accurate within the range of about 40° C. to about 100° C., and that is equipped with line 208 to communicate with the computer 200, which may include simple electrical wires, wireless or wired data connections, or free-space optical connections. The computer 200 may be connected likewise with many similar sensors 126 within other similar first fluid containers 124 at different locations, or nodes (not shown) by lines 208.

For example, several similar solar power sub-systems 110 and the battery 202 may be connected to form system 100 by an information network controlled by the computer/controller 200. The sub-systems 110 may be configured to deliver electrical power to and from one another as is most efficient for generating power from pre-heated bodies of water contained within the sub-systems. In an embodiment, in such a network of solar power sub-systems 110, the temperature sensors 126 in each first fluid container 124 may send their readings to the central or local computer/controller 200, which then compares the readings from all the temperature sensors and find the one that is hottest, or closest to boiling. For example, the computer/controller 200 may determine that the water in a first fluid container 124, referred to as Reservoir A, has reached a sufficient pre-heated temperature to boil with the amount of electrical energy available from the network at the moment. The computer/controller 200 then (a) releases the pre-heated water from the first fluid container 124 to the second fluid container 132 via valve 154 and (b) instructs the combined DC photovoltaic electrical power from the network of photovoltaic panels 122 and battery (or batteries) 202 to be then delivered to the heater 138 of the second fluid container 132 to bring the water to a boil, and the energy is extracted via the turbine 142.

Afterwards, the computer/controller 200 searches for the next sub-system 110 to reach a critical point close enough to boil with available DC power from the network, and the process is repeated, sequentially. This example enables the system to adjust to the local and temporal fluctuations of the incident solar radiation on any given photovoltaic panel 122. The conditions over many photovoltaic panels 122 may vary, but at any given moment, the water in the most optimally heated photovoltaic panel 122 will be boiled with the combined photovoltaic power of the networked panels. This enables photovoltaic panels 122 facing in different, and even opposite, directions to contribute more efficiently to solar power generation at any given time, without repositioning. This approach avoids having to use costly solar tracking equipment that has an added maintenance burden In this and other examples, the DC power 212 from the photovoltaic panels 122 may first be delivered to one or more batteries 202 or other power storage devices by way of the computer/controller 200 and stored there until it is sent to a selected heating reservoir 132 and used to boil sufficiently pre-heated water from the first fluid container 124.

An example of the function of the system 100, which is a network of the sub-systems 110, and its operation is given as follows.

A network, or system, 100 as described above is distributed spatially over a large area, with the photovoltaic panels 122 facing in arbitrarily same or different directions. The direction and intensity of sunlight incident on each photovoltaic panel 122 may vary throughout the day, in different patterns for each panel depending on its location, orientation, and individual state of cleanliness or local shading, etc. The photoelectric energy from all the photovoltaic panels 122 is delivered to and stored in the central battery 202 or a distributed network of batteries (not shown) continuously over time via electrical connections 212, either to the computer/controller 200 or directed to the battery(ies) 202. The temperature sensors 126 in each first fluid container 124 monitor the temperature of the water being heated by the sun impinging on the photovoltaic panels 122, and, for example, on a warm day of about 80° F., if the water in most of the apparatuses 120 is heating above 90° F., the computer/controller 200 compares the temperatures of all the apparatuses and selects the one that has exceeded or is closest to a given threshold, for example, 105° F. At the instant that the computer/controller 400 has received a reading above this threshold from an apparatus 120, it sends a signal to an actuator (not shown) controlling the release valve 154 at that apparatus to release the preheated water to its associated second fluid container 132, and close the valve after a certain amount of water has been delivered, i.e., after the first fluid container 124 has emptied, or the heating reservoir 130 is filled, or the amount delivered equals the amount that could be brought to a boil with the DC power available. The transfer of pre-heated water from the first fluid container 124 to the second fluid container 132 may occur over several steps, interspersed by the boiling and generation events using the water delivered in the previous step. Then, the combined photovoltaic energy stored in the battery network over the time interval since the previous generation event is delivered to the heating element 138 in that specific second fluid container 132 via electrical connection, or leads, 136 to further heat the water from 105° F. to above 212° F., the boiling point of water. (The water typically needs to be heated significantly above its boiling point, as the Carnot Efficiency of a heat engine increases with its temperature. However, in this example, the case of bare minimum boiling is used for illustration.) At this point, it expands by up to about 1600 times and is under high pressure within the second fluid container 132. Communication line 208 conveys temperature readings to the computer/controller 200 from the temperature sensor 134; communication line 206 conveys actuator signals to the valve 156 to open (and close) it, to allow steam to escape into the turbine generator 140, where the steam turns the turbine 142 to generate AC power.

The pressurized steam is released—again through the release valve 156 that is actuated by the computer/controller 200—into the turbine generator 140 to turn the turbine 142, which consists of rotating blades that are coupled to an axle that is coaxially coupled with a permanent or electro-inductive magnet that is in close proximity with an electric coil that is connected to the outside grid 214, either directly or indirectly through the computer/controller 200. The steam turns the turbine blades, which in turn rotate the magnet and induce AC current in the coil, which is the final generated power 212. The amount of power generated by this event is a function of the steam temperature, pressure, and the specific Carnot efficiency of the system, but properly implemented, it may be argued to be greater than the panel-generated photovoltaic power alone by potentially a factor of two or even three. Afterwards, the next generation event is triggered in another apparatus 120 meeting the threshold temperature criteria set by the computer, and then another, and so forth.

The energy delivered to the heating element 138 to heat the water may be sufficient to boil the amount of water being held in the second fluid container 132 (equal to the amount of water preheated in the first fluid container 124). If, for example, the amount of water is 100 g, to heat it from 105° F. to 213° F. (slightly above boiling) would require around 240 kJ of heat. This equates to 240 kW-sec, or about the energy produced by a typical solar panel 122 operating at 240 Watts over 1000 seconds. If there are 10 such panels in the system 100 available, this amounts to 100 seconds of their stored energy, and so a generation event, in which the water is boiled and its steam turns the turbine generator 140, would be possible every 1 minute 40 seconds on the basis of available stored photovoltaic energy. Assuming this constant rate of operation would imply that the water in each sub-system 110 needs to typically heat from its original temperature (ambient, which for this treatment is assumed to be usually room temperature, 25° C. or 77° F.) to the desired 105° F. within 16 minutes 40 seconds, the time consumed if every sub-system 110 in the system 100 undergoes a generation event in sequence. However, the variation of solar heating rates between sub-systems 110, the inefficiencies of delivering DC power 212, and heating using that power, as well as the time required to bring water to boil, generally retard the rate at which generation can occur. Lowering the temperature threshold for a generation event to trigger may increase the rate, but will increase the dependence on the output from the photovoltaic panels 122. The timing and temperature threshold for initiating the generation event are determined by the computer/controller 200 using the amount of stored energy in the battery 202 or total available energy in the local system or grid 214 as the main variable. The means of communication between the networked devices may follow those commonly practiced, and may be described as a variant of the "smart grid" or a subset of the Internet of Things (IoT). The present teachings are not dependent on the specific methods of sensing, communication and actuation, as long as it achieves the effects described here.

As disclosed above with reference to system 100, generation of AC power from a body of water pre-heated by exposure to solar radiation is achieved by further heating it by electrical heating element 138. To maximize the efficiency of this generation, several performance parameters can be tightly monitored and/or controlled:

temperature measurement accuracy, reliability, and promptness;
  setting points for threshold temperature to trigger fluid transfer and boiling;
  availability of DC electrical power from batteries or local sources generating in real-time;
  timing of delivery of DC power to the heating element; and
  priority of delivery of DC power to a single heating element 138 among multiple such units within a networked system 100.

In other words, the system 100 needs to determine when to transfer water from one component to the next, and when to deliver electrical power to that sub-system 110, from which source, and which sub-system to select for this process at a given time. All this must be done with the minimum amount of energy spent on operating the components or lost due to sub-optimal timing of the generation event.

In some examples, if there is no demand for power from the grid 214, the triggering of the generation events may be delayed even when the temperature of the water stored in some of the subsystems has exceeded the threshold temperature. In this case, the temperature threshold may be increased so as to decrease the frequency of generation events, or the power generated at the turbine may be stored in batteries to be used for later generation events. Conversely, if there is heavy demand for power from the grid 214, the threshold may be lowered so as to trigger more frequent generation events, at the cost of using more stored or real-time generated photovoltaic power.

Method for Power Generation Using Solar Energy

FIG. 8 depicts an example system 100, comprising a plurality of sub-systems 110-1, 110-2, 110-3, . . . 110-M, 110-M+1, . . . 110-N. Each sub-system 110 includes the components shown in previous Figures. Of particular focus in FIG. 8 is the depiction of a temperature sensor 134 and a heater 138 for each sub-system. Corresponding to the various sub-systems 110, temperature sensors 134-1, 134-2, 134-3, . . . , 134-M, 134-M+1, . . . , 134-N and heaters 138-1, 138-2, 138-3, . . . , 138-M, 138-M+1, . . . , 138-N are shown.

The computer/controller 200 is linked to all the temperature sensors 134 and all the heaters 138, although for the sake of clarity, not all connections are shown. All connections, however, are shown that involve the $M^{th}$ sub-system, including the temperature sensor 134-M, the heater 138-M, and the valve 156-M that allows steam to enter the turbine generator 140.

Likewise, the battery 202 is linked to all the heaters 138, although for the sake of clarity, not all connections are shown. All connections, however, are shown that involve the $M^{th}$ sub-system, including the heater 138-M.

The computer/controller 200 receives input 800 as to grid demand, grid stability, the price of power, and other data that help the computer/controller to meter out AC power to the grid 214.

An example of an algorithm or decision chart for sequencing sub-systems 110 for power generation using photoelectric energy to augment solar heated water, with a computing device with various inputs and logic functions based thereon, may be used to lead to the selection of a particular sub-system for triggering a generation event.

In addition to receiving the inputs from the various components of each of the sub-systems 110, the computer 200 also receives external inputs 800, such as electrical grid demand, grid stability, price of power, etc.

In the example depicted in FIG. 8, it is assumed that there are N sub-systems 110, thereby providing N heaters 138, N temperature sensors 134, and N valves 156 to be opened to drive the turbines 142. Considering now the $M^{th}$ sub-system (where M<N), the algorithm or decisions chart below illustrates the sequence of steps to take to open valve 156-M.

1. →t0:
2. Max {Ti}=$T_M$
3. $T_M > T_{threshold}$? YES
4. Battery power sufficient? YES
5. Grid demand? YES
6. Grid stable? YES
7. →t1: Open valve $V_M$
8. →t2: Trigger Heater M Having processed sub-systems 110 up to (but not including) the $M^{th}$ sub-system 110-M, the computer/controller 200 now turns to the $M^{th}$ sub-system and resets an internal clock to time t=0 (step 1). Having processed the prior sub-systems 110, the computer/controller 200 identifies the maximum temperature T of the fluid in the second fluid reservoir 132 as $T_M$ (step 2). The computer/controller 200 determines if the temperature $T_M$ exceeds the pre-set threshold temperature $T_{threshold}$ (step 3). If "no", then the computer/controller 200 moves to the $M+1^{st}$ sub-system, resets the time to t=0 and repeats the process from the beginning. If "yes", then the computer/controller 200 determines if the power present in the battery 202 is sufficient to operate the heater 138-M (step 4). If "yes", then the computer/controller 200 determines if there is sufficient grid demand (step 5). If "yes", then the computer/controller 200 determines if the grid is stable (step 6). If "yes" then at time t1, the computer/controller 200 sends a signal to valve 156-M (an outlet valve) to open it (step 7). Then, at time t2, the computer/controller 200 sends a signal to heater 138-M and the battery 202 to initiate heating (step 8). The process for the $M^{th}$ sub-system 110-M is complete when the second fluid container 132 of the $M^{th}$ sub-system is empty. At that point, the computer/controller 200 closes valve 156-M, moves to the $M+1^{st}$ sub-system 110-M+1, resets the time to t=0 and begins the process described above anew.

After water has entered the second fluid container 132 with water heater 138-M from the first fluid container 124 through valve 154, and has boiled the water to a sufficient temperature, as measured by either a temperature sensor or pressure sensor (not shown), 156-M opens to release the steam to turbine generator 140, in which the rotation of the turbine blades of turbine 142 are coupled to a coil within a magnetic field and cause the inductive generation of an AC current, which is delivered to the grid 214 either directly or via the computer/controller 200.

Alternately, and also consistently with the example depicted in FIG. 8, the computer/controller 200 may at an arbitrary time set its internal clock to t=0, then compare all the measured temperature inputs received from the N sub-systems 110 ($T_i$) with one another. Among these N inputs, the maximum value is measured at one of the sub-systems 110, which may be called the $M^{th}$ sub-system 110-M. The computer/controller 200 may then determine if the temperature $T_{ran}$ exceeds the pre-set threshold temperature $T_{threshold}$. If "no", then the computer/controller 200 resets the time to t=0 and repeats the process from the beginning, until a sub-system temperature is found that does exceed the threshold. If "yes", then the computer/controller 200 determines if the power present in the battery 202 is sufficient to operate the heater 138-M. If "yes", then the computer/controller 200 determines if there is sufficient grid demand. If "yes", then the computer/controller 200 determines if the grid is stable. If "yes" then at time t1, the computer/controller 200 sends a signal to valve 156-M to open it. Then, at time t2, the computer/controller 200 sends a signal to heater 138-M and the battery 202 to initiate heating. The process for the $M^{th}$ sub-system 110-M is complete when the second fluid container 132 of the $M^{th}$ sub-system 110-M is empty. At that point, the computer/controller 200 closes valve 156-M, resets the time to t=0 and begins the process described above anew.

In addition to the steps described in the example above, there are multiple additional steps involved in the generation event that can be sequenced and actuated by the computer/controller 200 in similar fashion, such as cutting off the power to the heater 138, opening and closing the valve 156 between the second fluid container 132 and the turbine generator 140, and opening and closing the valve 152 regulating the water inlet to the first fluid container 124 to refill it after it has emptied. These steps may be sequenced using predetermined time intervals between actuator commands, or in response to signals from the relevant components indicating that the conditions for actuation have been met, based on a predetermined or variable but programmed criteria.

According to the present teachings, all aspects of and surrounding the generation events that can be measured and controlled are measured and controlled by the computer, and depending on its sophistication, may be regulated and optimized so as to maximize the efficiency of the power generation given the available solar radiation and external energy sources, or alternately the cost efficiency of such generation. The means of doing so are by controlling the timing, duration, and sequence of the various mechanisms contained in sub-systems 110 and throughout system 100.

When multiple sub-systems 110 simultaneously exceed the temperature threshold, and the demand warrants it, the computer may trigger generation events in the multiple sub-systems simultaneously.

The computer/controller 200 or multiple computer/controllers may be connected by electrical, optical, or radio frequency means to a temperature sensor 134, release valves 152, 154, 156 in pipes, and heating elements 138 associated with a generation unit consisting of a photovoltaic panel 122 and first fluid container 124.

Signals originated by sensor(s) 134 that arrive at the computer/controller 200 may be evaluated and compared to one another and against a predetermined set point. Upon meeting a set of criteria, the signals may trigger a command to open release valve 156 and deliver electrical power that is real-time generated or stored in the battery 202 to a heating element 138 in the second fluid container 132.

Figure 9:
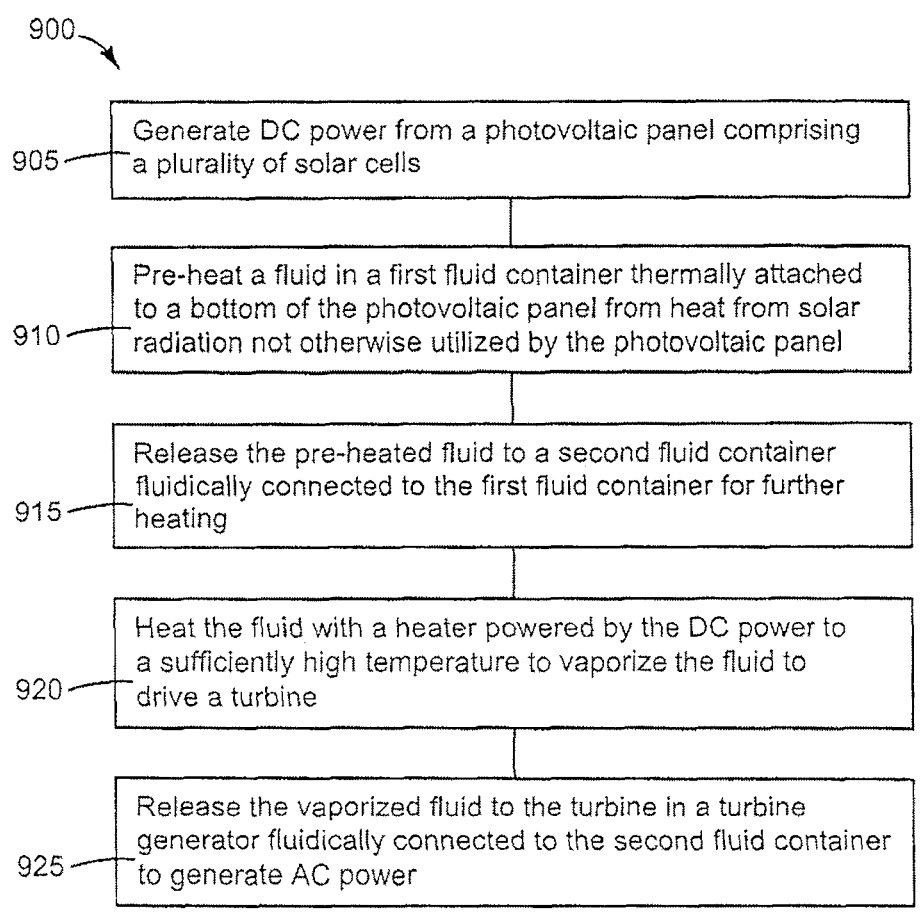
FIG. 9 is a flow chart depicting a method for generating power in the system.

FIG. 9 depicts a method 900 for generating power in system 100. The method 900 includes generating 905 DC power from the photovoltaic panel 122 comprising a plurality of solar cells 122a. The method 900 further includes pre-heating 910 a fluid in the first fluid container 124 thermally attached to a bottom of the photovoltaic panel 122 from heat from solar radiation not otherwise utilized by the photovoltaic panel. The method additionally includes releasing 915 the pre-heated fluid to a second fluid container 132 fluidically connected to the first fluid container 124 for further heating. The method 900 yet further includes heating 920 the fluid with a heater 138 powered by the DC power to a sufficiently high temperature to vaporize the fluid to drive a turbine 142. The method 900 concludes with releasing 925 the vaporized fluid to the turbine 142 in a turbine generator 140 fluidically connected to the second fluid container 132 to generate AC power. Details for implementing these steps have been described above.

The aforementioned systems and components have been described with respect to interaction between several components. It can be appreciated that such systems and components can include those components or specified sub-components, some of the specified components or sub-components, and/or additional components, and according to various permutations and combinations of the foregoing. Sub-components can also be implemented as components communicatively coupled to other components rather than included within parent components (hierarchical). Additionally, it is to be noted that one or more components may be combined into a single component providing aggregate functionality or divided into several separate sub-components. Any components described herein may also interact with one or more other components not specifically described herein.

In addition, while a particular feature of the subject innovation may have been disclosed with respect to only one of several implementations, such feature may be combined with one or more other features of the other implementations as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

The embodiments and examples set forth herein were presented in order to best explain various selected embodiments of the present invention and its particular application and to thereby enable those skilled in the art to make and use embodiments of the invention. However, those skilled in the art will recognize that the foregoing description and examples have been presented for the purposes of illustration and example only. The description as set forth is not intended to be exhaustive or to limit the embodiments of the invention to the precise form disclosed.

Thus, there have been described examples and embodiments of a system for power generation using solar energy and a method for generating power in such a system. It is to be understood that the above-described examples are merely illustrative of some of the many specific examples that represent the principles described herein. Clearly, those skilled in the art can readily devise numerous other arrangements without departing from the scope as defined by the following claims.

What is claimed is:

1. A sub-system for a power generation system using solar energy, including:
    an apparatus comprising:
        a photovoltaic panel comprising a plurality of solar cells configured to generate DC power,
        a first fluid container thermally attached to a bottom of the photovoltaic panel and configured to pre-heat a fluid contained therein from heat from solar radiation not otherwise utilized by the photovoltaic panel, and
        a first temperature sensor for sensing a temperature of the fluid inside the first fluid container;
    a heating assembly, including a second fluid container, a second temperature sensor, and an electrical heating element, the second fluid container fluidically connected to the first fluid container, the heating element configured to heat the pre-heated fluid in the second fluid container to a vapor;
    a turbine generator fluidically connected to the second fluid container to generate AC power from the vapor; and
    a first control valve which, when opened, allows ambient temperature fluid from an external source into the first fluid container, and does so when instructed to do so by signals received from an external controller, or when an internal sensor in the first fluid container indicates the first fluid container is empty.

2. The sub-system of claim 1, wherein the photovoltaic panel has at least one photovoltaic cell on its surface that is facing a direction in which it may be exposed to solar radiation.

3. The sub-system of claim 2, wherein the first fluid container has tubular channels within a metallic block, a pipe or pipes bent into a coil, a baffle, multiple pipes in parallel, or a shaped channel with fin-like protrusions.

4. The sub-system of claim 2, wherein the photovoltaic panel is directly deposited or otherwise formed onto the surface of the first fluid container, such that the photovoltaic panel is conformally adhered to the first fluid container without substantial gaps.

5. The sub-system of claim 1 further including a second control valve, which, when opened, releases the fluid within the first fluid container to the second fluid container, and which does so when instructed to do so by signals received from the external controller.

6. The sub-system of claim 1 further including an additional control valve, which, when opened, releases the vapor within the second fluid container to the turbine generator when instructed to do so by signals received from the external controller.

* * * * *